United States Patent
Kondo et al.

(10) Patent No.: US 8,429,508 B2
(45) Date of Patent: Apr. 23, 2013

(54) DATA STORAGE APPARATUS WITH ENCODER AND DECODER

(75) Inventors: Yosuke Kondo, Fussa (JP); Kenji Yoshida, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/174,596

(22) Filed: Jun. 30, 2011

(65) Prior Publication Data

US 2012/0110416 A1    May 3, 2012

(30) Foreign Application Priority Data

Oct. 29, 2010    (JP) ................. 2010-244306

(51) Int. Cl.
    *H03M 13/00*    (2006.01)
(52) U.S. Cl.
    USPC ............................. 714/777; 714/752; 714/763
(58) Field of Classification Search ............ 714/777, 714/763, 752, 703, 746, 6
    See application file for complete search history.

(56) References Cited

U.S. PATENT DOCUMENTS

| | | | | |
|---|---|---|---|---|
| 7,020,811 B2 * | 3/2006 | Byrd | ............................. | 714/703 |
| 7,680,995 B1 * | 3/2010 | Chang | ............................. | 711/162 |
| 2009/0249148 A1 * | 10/2009 | Ito et al. | ........................ | 714/746 |
| 2011/0064123 A1 * | 3/2011 | Agazzi et al. | ................. | 375/219 |
| 2011/0225475 A1 * | 9/2011 | Kumar et al. | ................. | 714/763 |

FOREIGN PATENT DOCUMENTS

| | | |
|---|---|---|
| JP | 4130550 | 5/1992 |
| JP | 2001-102938 | 4/2001 |
| JP | 2007-141411 | 6/2007 |
| JP | 2008-199148 | 8/2008 |
| JP | 2008-288710 | 11/2008 |
| JP | 2009-510875 | 3/2009 |
| JP | 2009-100421 | 5/2009 |

* cited by examiner

*Primary Examiner* — Fritz Alphonse
(74) *Attorney, Agent, or Firm* — Patterson & Sheridan, LLP

(57) ABSTRACT

According to one embodiment, an encoder/decoder apparatus includes an encoder module, a decoder module, and a transposing module. The encoder module is configured to generate a Hamming code from the input data, in accordance with a check matrix having a specific regularity. The decoder module is configured to detect an error position in the output data composed of the Hamming code, in accordance with the check matrix. The transposing module is configured to perform a transposing process of transposing some of the columns of the check matrix, while maintaining the regularity of the check matrix, and to change the error position in accordance with the transposing process, during the decoding process.

7 Claims, 9 Drawing Sheets

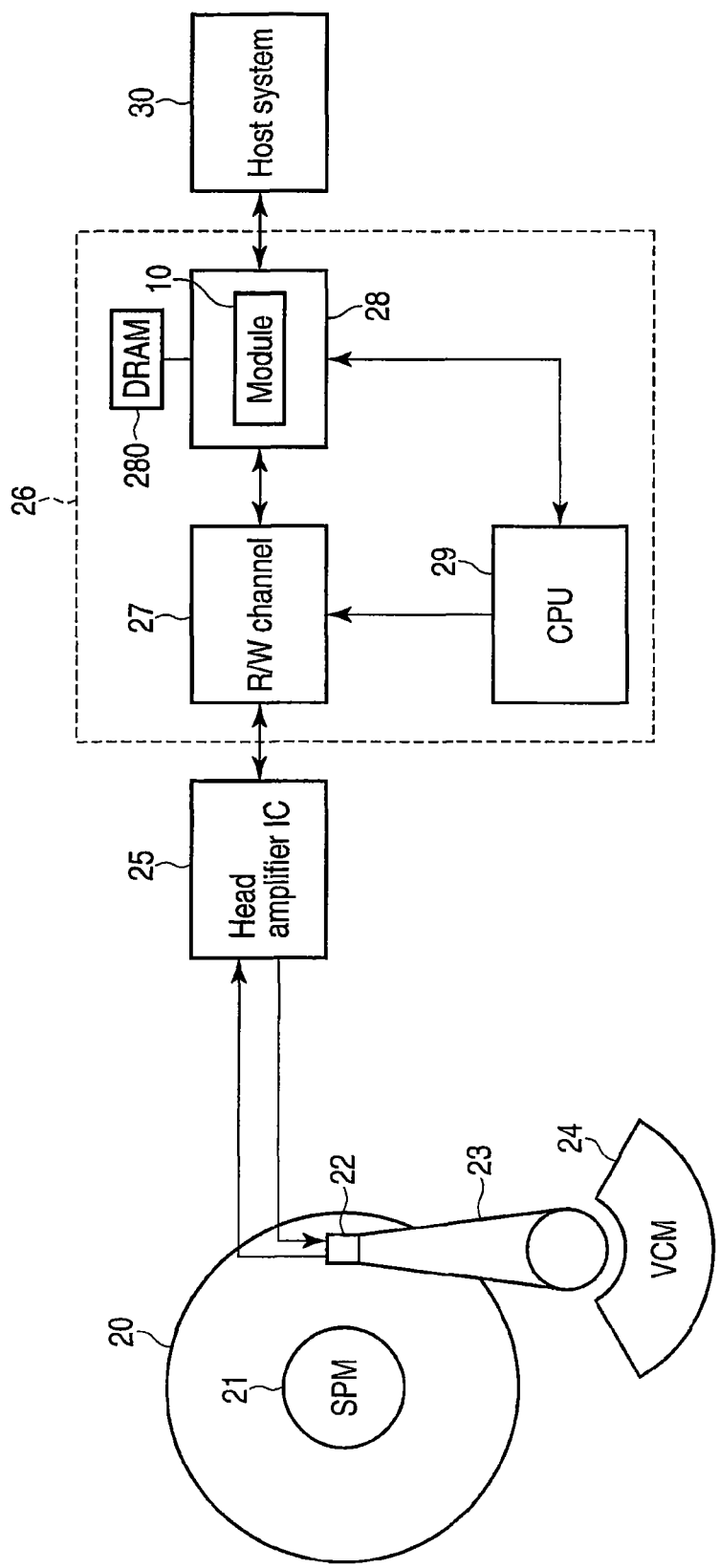
F I G. 2

Check matrix before transposition $$\begin{pmatrix} 1 & 1 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 & 1 \\ 1 & 0 & 0 & \cdots & & & & 0 & 0 & 0 & 0 & 1 & 0 \\ 0 & 0 & 0 & \cdots & & & & 0 & 0 & 0 & 0 & 1 & 1 \\ 1 & 1 & 0 & 0 & 0 & 0 & 0 & 0 & 0 & 0 & 1 & 0 & 0 \\ 0 & 1 & 0 & & \cdots & & & 0 & 0 & 0 & 1 & 0 & 1 \\ 1 & 0 & 0 & & \cdots & & & 0 & 0 & 0 & 1 & 1 & 0 \\ 0 & 0 & 0 & & \cdots & & & 0 & 0 & 0 & 1 & 1 & 1 \\ 1 & 1 & 0 & 0 & 0 & 0 & 0 & 0 & 0 & 1 & 0 & 0 & 0 \\ 0 & 1 & 0 & & \cdots & & & & 0 & 0 & 1 & 0 & 0 & 1 \\ & & & & \cdots & & & & & \cdots & & & \\ & & & & \cdots & & & & & \cdots & & & \\ 0 & 0 & 0 & 0 & 0 & 0 & 0 & 1 & 1 & 1 & 1 & 1 & 1 \\ 1 & 1 & 0 & 0 & 0 & 0 & 0 & 1 & 0 & 0 & 0 & 0 & 0 \\ 0 & 1 & 0 & 0 & 0 & 0 & 0 & 1 & 0 & 0 & 0 & 0 & 1 \\ & & & & \cdots & & & & & \cdots & & & \\ & & & & \cdots & & & & & \cdots & & & \\ 0 & 0 & 0 & 0 & 0 & 0 & 1 & 1 & 1 & 1 & 1 & 1 & 1 \\ & & & & \cdots & & & & & \cdots & & & \\ & & & & \cdots & & & & & \cdots & & & \\ 0 & 0 & 1 & 1 & 1 & 1 & 1 & 1 & 1 & 1 & 1 & 1 & 1 \\ 1 & 0 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 & 0 \\ & & & & \cdots & & & & & \cdots & & & \\ & & & & \cdots & & & & & \cdots & & & \\ 0 & 0 & 0 & 0 & 0 & 0 & 0 & 0 & 0 & 0 & 0 & 0 & 1 \end{pmatrix}$$

Transposition (rows 1–5)
Transposition (middle)
Transposition (lower)

F I G. 5

Check matrix after transposition $$\begin{bmatrix}
1 & 1 & 0 & 0 & 0 & 0 & 0 & 0 & 0 & 0 & 1 & 0 & 0 \\
0 & 1 & 0 & 0 & 0 & 0 & 0 & 0 & 0 & 0 & 0 & 0 & 1 \\
1 & 0 & 0 & \cdots & & & & 0 & 0 & 0 & 0 & 1 & 0 \\
0 & 0 & 0 & \cdots & & & & 0 & 0 & 0 & 0 & 1 & 1 \\
1 & 1 & 0 & 0 & 0 & 0 & 0 & 0 & 0 & 0 & 0 & 0 & 0 \\
0 & 1 & 0 & \cdots & & & & 0 & 0 & 0 & 1 & 0 & 1 \\
1 & 0 & 0 & \cdots & & & & 0 & 0 & 0 & 1 & 1 & 0 \\
0 & 0 & 0 & \cdots & & & & 0 & 0 & 0 & 1 & 1 & 1 \\
0 & 0 & 0 & 0 & 0 & 0 & 0 & 1 & 1 & 1 & 1 & 1 & 1 \\
0 & 1 & 0 & \cdots & & & & 0 & 0 & 1 & 0 & 0 & 1 \\
& & & \cdots & & & & & & \cdots & & & \\
& & & \cdots & & & & & & \cdots & & & \\
1 & 1 & 0 & 0 & 0 & 0 & 0 & 0 & 0 & 1 & 0 & 0 & 0 \\
1 & 1 & 0 & 0 & 0 & 0 & 1 & 0 & 0 & 0 & 0 & 0 & 0 \\
0 & 1 & 0 & 0 & 0 & 0 & 1 & 0 & 0 & 0 & 0 & 0 & 1 \\
& & & \cdots & & & & & & \cdots & & & \\
& & & \cdots & & & & & & \cdots & & & \\
0 & 0 & 1 & 1 & 1 & 1 & 1 & 1 & 1 & 1 & 1 & 1 & 1 \\
& & & \cdots & & & & & & \cdots & & & \\
& & & \cdots & & & & & & \cdots & & & \\
0 & 0 & 0 & 0 & 0 & 0 & 1 & 1 & 1 & 1 & 1 & 1 & 1 \\
1 & 0 & 0 & 0 & 0 & 0 & 0 & 0 & 0 & 0 & 0 & 0 & 0 \\
0 & 1 & 0 & 0 & 0 & 0 & 0 & 0 & 0 & 0 & 0 & 0 & 0 \\
0 & 0 & 1 & 0 & 0 & 0 & 0 & 0 & 0 & 0 & 0 & 0 & 0 \\
& & & \cdots & & & & & & \cdots & & & \\
& & & \cdots & & & & & & \cdots & & & \\
0 & 0 & 0 & 0 & 0 & 0 & 0 & 0 & 0 & 0 & 0 & 0 & 1 \\
\end{bmatrix}$$

FIG. 6

```
11 000000 0001100          00 000000 1111111          11 111111 1111111
   XOR(exclusive OR)           XOR(exclusive OR)          XOR(exclusive OR)
11 000000 0000000          11 000000 0010000          00 000001 1111111
        =                         =                          =
00 000000 0001100          11 000000 1101111          11 111110 0000000
```

FIG. 7A    FIG. 7B    FIG. 7C

$$\begin{bmatrix}
0\ 0 & 0\ 0\ 0\ 0\ 0\ 0 & 0\ 0\ 0\ 1\ 0\ 0 \\
0\ 0 & 0\ 0\ 0\ 0\ 0\ 0 & 0\ 0\ 0\ 0\ 0\ 0 \\
0\ 0 & 0\ \cdots & 0\ 0\ 0\ 0\ 0\ 0 \\
0\ 0 & 0\ \cdots & 0\ 0\ 0\ 0\ 0\ 0 \\
0\ 0 & 0\ 0\ 0\ 0\ 0\ 0 & 0\ 0\ 0\ 1\ 0\ 0 \\
0\ 0 & 0\ \cdots & 0\ 0\ 0\ 0\ 0\ 0 \\
0\ 0 & 0\ \cdots & 0\ 0\ 0\ 0\ 0\ 0 \\
0\ 0 & 0\ \cdots & 0\ 0\ 0\ 0\ 0\ 0 \\
1\ 1 & 0\ 0\ 0\ 0\ 0\ 0 & 1\ 1\ 0\ 1\ 1\ 1 \\
0\ 0 & 0\ \cdots & 0\ 0\ 0\ 0\ 0\ 0 \\
& \cdots & \cdots \\
& \cdots & \cdots \\
1\ 1 & 0\ 0\ 0\ 0\ 0\ 0 & 1\ 1\ 0\ 1\ 1\ 1 \\
0\ 0 & 0\ \cdots & 0\ 0\ 0\ 0\ 0\ 0 \\
0\ 0 & 0\ \cdots & 0\ 0\ 0\ 0\ 0\ 0 \\
& \cdots & \cdots \\
& \cdots & \cdots \\
0\ 0 & 1\ 1\ 1\ 1\ 1\ 0 & 0\ 0\ 0\ 0\ 0\ 0 \\
& \cdots & \cdots \\
& \cdots & \cdots \\
0\ 0 & 1\ 1\ 1\ 1\ 1\ 0 & 0\ 0\ 0\ 0\ 0\ 0 \\
0\ 0 & 0\ 0\ 0\ 0\ 0\ 0 & 0\ 0\ 0\ 0\ 0\ 0 \\
0\ 0 & 0\ 0\ 0\ 0\ 0\ 0 & 0\ 0\ 0\ 0\ 0\ 0 \\
0\ 0 & 0\ 0\ 0\ 0\ 0\ 0 & 0\ 0\ 0\ 0\ 0\ 0 \\
& \cdots & \cdots \\
& \cdots & \cdots \\
0\ 0 & 0\ 0\ 0\ 0\ 0\ 0 & 0\ 0\ 0\ 0\ 0\ 0
\end{bmatrix}$$

Rows 1 and 5: Difference between two column vectors (Result of exclusive OR operation)

Rows 9 and 13: Difference between two column vectors (Result of exclusive OR operation)

Rows with `0 0 1 1 1 1 1 0 0 0 0 0 0 0`: Difference between two column vectors (Result of exclusive OR operation)

F I G. 8

DATA STORAGE APPARATUS WITH ENCODER AND DECODER

CROSS-REFERENCE TO RELATED APPLICATIONS

This application is based upon and claims the benefit of priority from Japanese Patent Application No. 2010-244306, filed Oct. 29, 2010; the entire contents of which are incorporated herein by reference.

FIELD

Embodiments described herein relate generally to a data storage apparatus having an encoder and an decoder.

BACKGROUND

Most data storage apparatuses and communication apparatuses incorporate an error correcting function of detecting data errors and correcting these errors. The error correcting function is implemented by the encoding/decoding system using Hamming codes (shortened Hamming codes) in which one bit of data can be corrected.

The encoding/decoding system performs an encoding process, in which a data bit string (data vector) and a generator matrix is used to generate Hamming codes. Further, the encoding/decoding system performs a decoding process, in which Hamming codes and a check matrix or a parity check matrix, either associated with the generator matrix, are utilized to detect error positions.

The data bit string corresponds to the input data stored in a recording medium (i.e., disk or memory provided in a data storage apparatus). The data bit string corresponds to the transmission data in a communication apparatus. The Hamming code is constituted by a data bit string and a parity bit string (parity data).

In the decoding process, the error positions (error addresses) are detected in the output data (i.e., received data in a communication apparatus) constituted by Hamming codes, and error data called "syndrome," which represents the error positions, is generated. An error correcting process is performed, correcting the error bits at the error positions detected in the decoding process. Data that is free of error bits can therefore be output.

In the encoding/decoding system using Hamming codes, the check matrix (or generator matrix) is a matrix having a specific regularity. In the check matrix (or generator matrix), the input data may be a bit pattern having regularity or a pattern in which a certain bit string is repeated. In this case, the parity data or syndrome generated may become all zero. Therefore, the encoding/decoding system can not perform a detecting and correcting errors process.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 2 is a block diagram showing the major components of a disk drive incorporating the encoder/decoder apparatus according to the embodiment;

FIG. 5 is a diagram explaining a process of transposing the elements in a check matrix according to the embodiment;

FIG. 6 is a diagram explaining another process of transposing the elements in a check matrix according to the embodiment;

FIGS. 7A, 7B and 7C are diagrams explaining an XOR operation performed on a check matrix according to the embodiment;

FIG. 8 is a diagram explaining an XOR operation performed on the row vectors in a check matrix according to the embodiment;

DETAILED DESCRIPTION

Various embodiments will be described hereinafter with reference to the accompanying drawings.

In general, according to one embodiment, an encoder/decoder apparatus includes an encoder module, a decoder module, and a transposing module.

The encoder module is configured to generate a Hamming code from the input data, in accordance with a generator matrix having a specific regularity. The decoder module is configured to detect an error position in the output data composed of the Hamming code, in accordance with the check matrix. The transposing module is configured to perform a transposing process of transposing some of the columns of the check matrix (or generator matrix), while maintaining the regularity of the check matrix (or generator matrix), and to change the error position in accordance with the transposing process, during the decoding process.

[Configuration of the Encoder/Decoder Apparatus]

Figure 1:
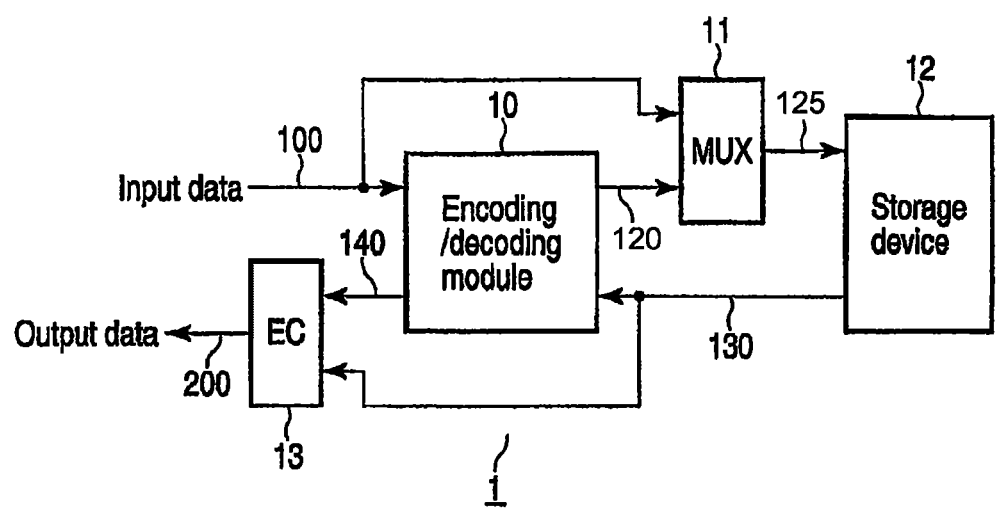
FIG. 1 is a block diagram explaining the configuration of an encoder/decoder apparatus according to an embodiment.

FIG. 1 is a block diagram that explains the configuration of the encoder/decoder apparatus according to this embodiment.

The encoder/decoder apparatus according to the embodiment can be used in data storage apparatuses such as hard disk drives (HDDs) and solid state drives (SSDs) and in communication apparatuses such as wireless communication apparatuses.

As shown in FIG. 1, the encoder/decoder apparatus 1 has an encoding/decoding module 10, a multiplexer (MUX) 11, and an error correction (EC) module 13. The encoder/decoder apparatus 1 is provided in the form of, for example, a one-chip integrated circuit. The encoding/decoding module 10 includes an encoding function of performing an encoding process on input data 100 transferred from, for example, a host system. The encoding/decoding module 10 further includes a decoding function of performing a decoding process on encoded data output from a storage device 12.

From the data bit string of input data 100, the encoding/decoding module 10 generates parity data 120 composed of a parity bit string. The multiplexer 11 generates encoded data (Hamming code) 125 composed of the data bit string of the input data 100 and the parity data 120. The encoded data 125 is stored into the storage device 12. Note that the input data 100 is equivalent to user data of one sector (512 bytes).

The encoding/decoding module 10 detects error positions (i.e., error addresses) in the encoded data (Hamming code)

130 output from the storage device 12, and generates error data (syndrome) 140 that represents the error positions. The error correction module 13 corrects the error positions detected in the encoded data 130 and represented by the error data 140, thereby generating output data 200 that is free of error positions. The output data 200 is data transferred to the host system or stored in the storage device 12.

[Configuration of the Disk Drive]

FIG. 2 is a block diagram showing the major components of a hard disk drive (hereinafter referred to as "disk drive") that incorporates the encoder/decoder apparatus 1 according to this embodiment.

As shown in FIG. 2, the disk drive is composed mainly of a head-disk assembly (HDA), a head amplifier integrated circuit (hereinafter referred to as "head amplifier IC") 25, and a circuit board 26. The head-disk assembly (HDA) has a disk 20, a spindle motor (SPM) 21, an arm 23, and a voice coil motor (VCM) 24. The disk 20 is a magnetic recording medium. The arm 23 holds a head 22.

The SPM 21 rotates the disk 20. The arm 23 and the VCM 24 constitute an actuator. When driven by the VCM 23, the arm 23 moves over the disk 20. The head 22 mounted on the arm 23 is therefore moved to a target position over the disk 20. The head 22 has a read head element and a write head element. The read head element is configured to read data from the disk 20. The write head element is configured to write data on the disk 20.

The head amplifier IC 25 has a read amplifier and a write driver. The read amplifier amplifies the read signal from the read head element and transmits the read signal to the read/write (R/W) channel 27 provided on the circuit board 26. The write driver receives a write current corresponding to the write data output from the R/W) channel 27 and transmits the write current to the write head element of the head 22.

The circuit board 26 includes a disk controller 28, a microprocessor (CPU) 29, and a buffer memory 280, in addition to the R/W channel 27. The R/W channel 27 includes a read channel and a write channel. The read channel processes read data, and the write channel processes write data. The CPU 29 is the main controller of the disk drive and performs servo control to position the head 22 with respect to the disk 20, and performs read/write control on the head 22.

The disk controller 28 performs an interface control, controlling the data transfer between the host system 30 and the R/W channel 27. The disk controller 28 includes an encoder/decoder apparatus 1 including the encoding/decoding module 10 as main component. The disk controller 28 controls the buffer memory 280, which is a DRAM. Controlled by the disk controller 28, the buffer memory 280 stores the user data transferred from the host system 30 or the data read from the disk 20.

The storage device 12 shown in FIG. 1 is equivalent to the buffer memory 280 constituted by, for example, a DRAM. The storage device 12 is equivalent to the disk 20, too. If the encoder/decoder apparatus 1 according to this embodiment is used in an SSD, the storage device 12 is either a buffer memory or a flash memory.

[Encoding Process and Decoding Process]

The configuration of the encoding/decoding module 10 according to this embodiment, and the encoding process and decoding process will be explained in detail with reference to FIGS. 3 to 6, FIGS. 7A to 7C, and FIGS. 8 to 10.

Figure 3:
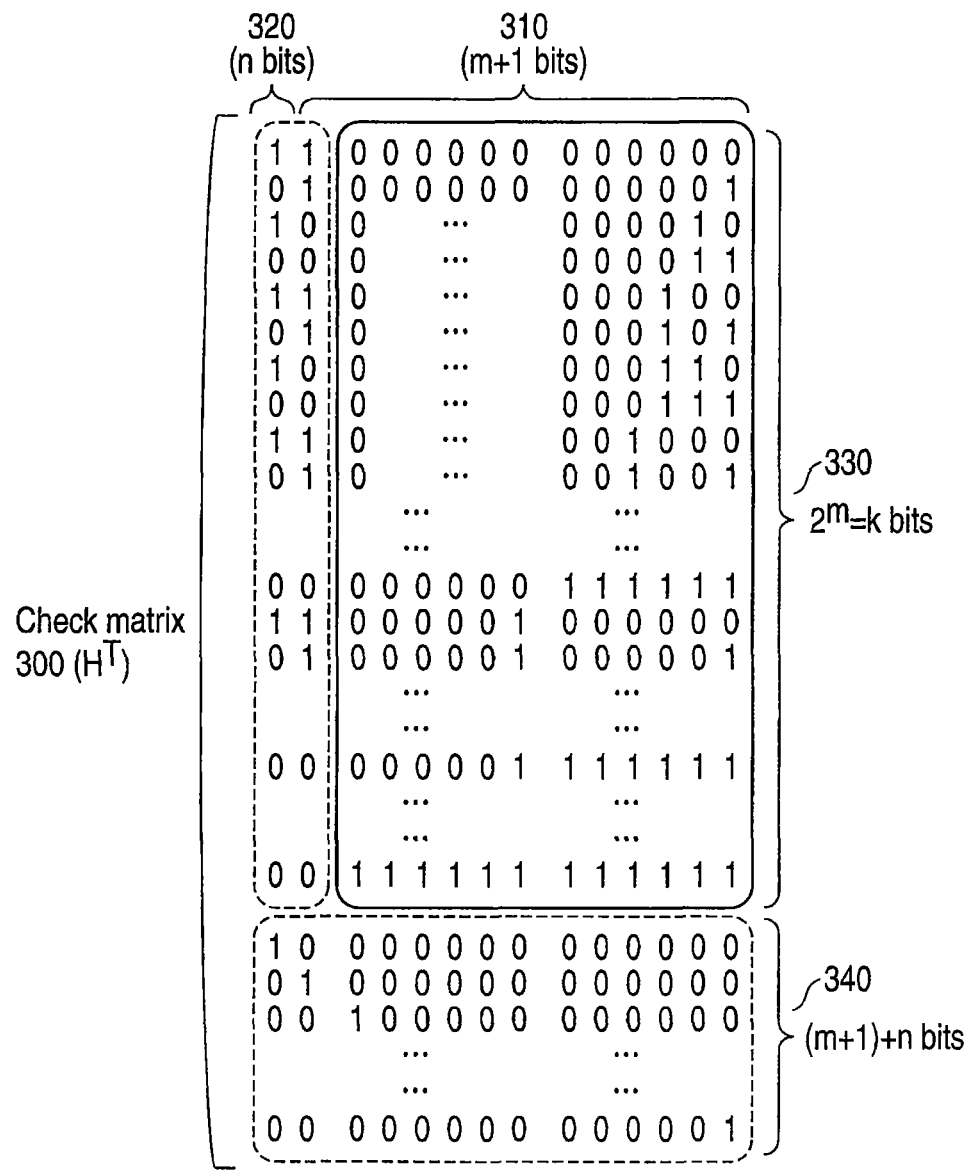
FIG. 3 is a diagram explaining the configuration of a check matrix according to the embodiment.

FIG. 3 shows the configuration of an exemplary transposed matrix of a check matrix (parity check matrix) 300 that the encoding/decoding module 10 uses to perform the encoding process and decoding process. Hereinafter, any transposed matrix of a check matrix and any generator matrix associated with a check matrix used in the encoding process will be generally called "check matrix."

The check matrix that can be used in this embodiment has a specific regularity and a configuration useful in the encoding process and decoding process. More specifically, the check matrix can help increase the speed of the encoding and decoding processes utilizing Hamming codes (shortened Hamming codes) in which one bit of data can be corrected. In the encoding process, the input data (data bit string) can be processed in units of, for example, power of two. Moreover, if a one-bit error occurs, the syndrome need not be converted to error addresses (error positions) in the decoding process. Whether error addresses and error exist or not can therefore be instantaneously determined.

As shown in FIG. 3, the check matrix 300 (or transposed matrix thereof) has a configuration in which additional bits 320 (n bits) are added to parity bits 310 (m+1 bits), i.e., minimum number of parity bits required if the input data 100 (later described in detail) consists of data bits 330 ("$2^m$=k" bits), thereby generating a parity bit string (parity data).

The data bits 330 form rows of bits, each row consisting of binary codes 0 to (k−1) sequentially arranged. The additional bits 320 define four types of repeated patterns, 11, 01, 10 and 00 or 11, 10, 01 and 00, so that the bit rows may not overlap the identity matrix 340.

In an example of the present embodiment, the data bits 330 are composed of 4096 bits (k=4096), 13 parity bits 310 (m=12) and three additional bits 320 (n=3). The data bits 330 are equivalent to 512 bytes that is a one-sector data in the disk drive.

The check matrix 300 is constructed in a specific method. First, $2^m$ combinations of the first 12 right columns are arranged in the ascending order or descending order. Next, three bits existing, respectively in the 13th, 14th and 15th columns from the right, are combined such that they may not overlap the identity matrix 340 often used in, for example, Hamming codes, and that each row may have two or more 1s. As a result, all elements of any row are exclusive to one another in the matrix, and the matrix can serve as a check matrix for Hamming codes in which one bit of data can be corrected.

Having such a configuration, the check matrix 300 can serve to output the values of, for example, the first to twelfth columns from the right, as error addresses representing error positions, if the syndrome is calculated for any one-bit errors during the decoding process. This renders it unnecessary to convert the syndrome to error addresses. The error addresses can therefore be obtained in one process cycle even if the code length is long. Moreover, whether the input data (data bit string) and the parity data (parity bit string) have errors or not can be instantaneously determined from the combination of the three highest bits and three lowest bits of the syndrome.

Figure 4:
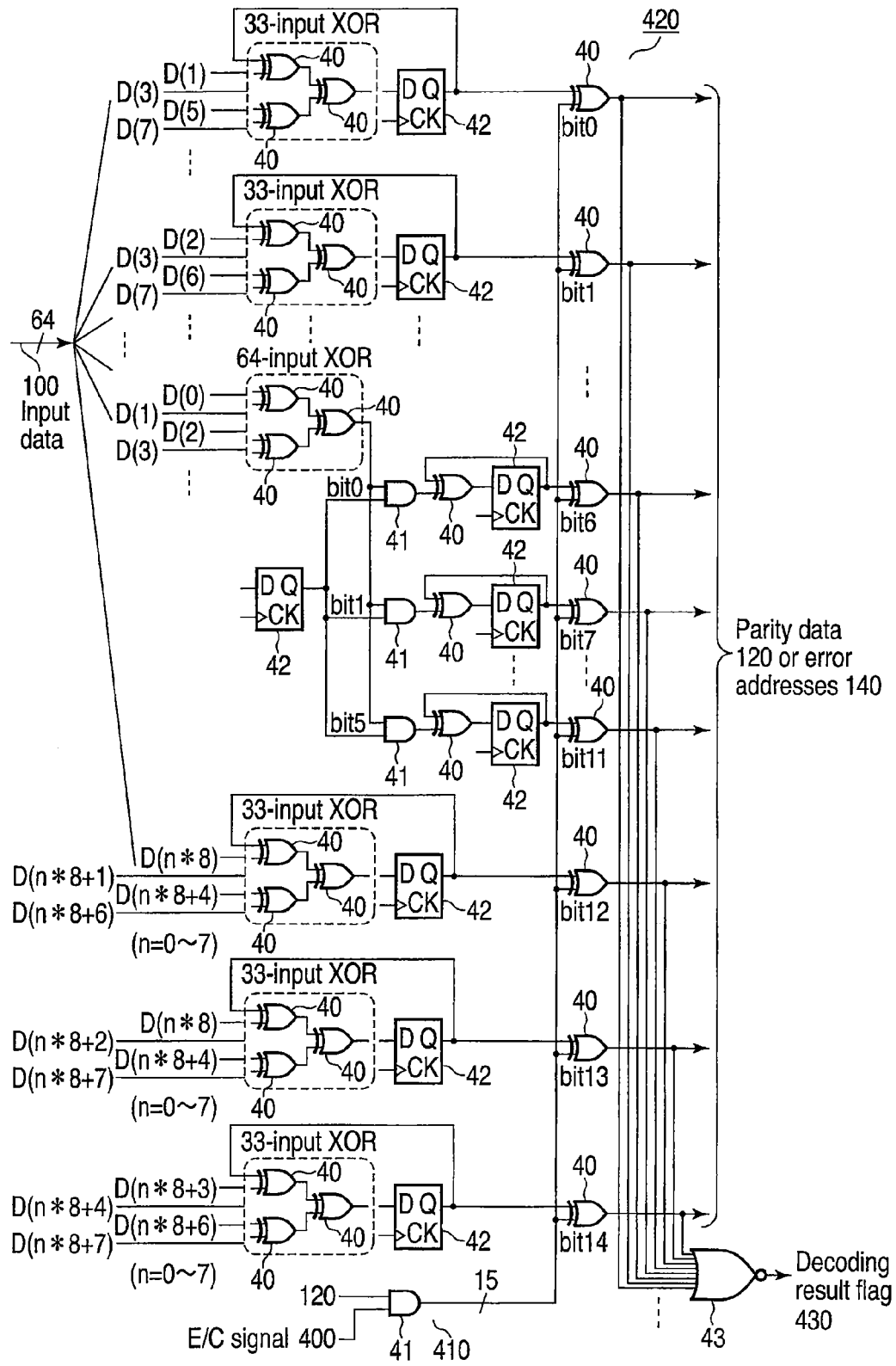
FIG. 4 a block diagram explaining the major components of the encoder/decoder apparatus according to the embodiment.

FIG. 4 a block diagram explaining the major logic components provided in the encoding/decoding module 10 according to the present embodiment.

As seen from FIG. 2, the encoding/decoding module 10 according to this embodiment performs an encoding process on the data 100 input to the buffer memory 280 constituted by, for example, a DRAM. The encoding/decoding module 10 also performs a decoding process on the encoded data 130 read from the buffer memory 280.

As FIG. 4 shows, the encoding/decoding module 10 includes, as major logic components, exclusive OR (XOR) gates 40, AND gates 41, flip-flops 42, and a NOR gate 43. The major logic components 40, 41 and 43 constitute a logic circuit 410. The logic circuit 410 switches the process, from the encoding process to the decoding process, and vice versa.

In the logic circuit 410, parity data 120 and an E/C signal 400 are input to the two input terminals of each AND gate 41, respectively. The E/C signal 400 (decode: "1") designates either encoding or decoding.

The encoding/decoding module 10 receives data 100 of, for example, 64 bits for each clock. In the encoding process, an E/C signal 400 (encode: "0") designating encoding is input, as the other input, to the logic circuit 410, and parity data 120 composed of, for example, 15 parity bits (i.e., parity bit string) is generated by, and output from, a output-side circuit 420 constituted by 15 XOR gates 40. The output-side circuit 420, which has 33-input XOR gates and 64-input XOR gates performs an operation on the 64-bit input data and the generation matrix corresponding to the check matrix.

In the decoding process, an E/C signal 400 (decode: "1") is input to the other input terminal of the logic circuit 410, and the encoded data 130 read from the buffer memory 280 is input to the encoding/decoding module 10. The encoded data 130 contains the 15-bit parity data 120 and the 64-bit input data 100, both generated in the encoding process.

The encoding/decoding module 10 receives the parity data 120 at one input terminal of the logic circuit 410. The encoding/decoding module 10 therefore performs a parity operation on the input data 100 and parity data 120. As a result, the output-side circuit 420 outputs, as syndrome, 12-bit error addresses 140. The encoding/decoding module 10 outputs, at the NOR gate 43, a decoding result flag 430 indicating whether errors exists or not.

Of the bits constituting the parity data 120, bits 0 to 5 are used in parity calculation, on those 32 bits of the 64-bit input data 100, which are always at fixed positions in the check matrix. The 33-input XOR circuits each perform parity calculation on 33 bits, i.e., those 32 bits and one bit fed back to the register (flip-flop 42) storing the result of parity calculation. Of the bits constituting the parity data 120, bits 6 to 11 undergo XOR operation at the 64-input XOR circuits. The result of this XOR and each bit of a 6-bit binary counter are subjected to AND operation, thereby accomplishing parity calculation. Further, of the bits constituting the parity data 120, bits 12 to 14 are concerned with the calculation on n bits included in the additional bits 320, and may therefore be used in parity calculation in accordance with the method of adding the bits 320. If single parity is added, a circuit may be added, which can perform XOR operation on all input bits.

Since the encoding/decoding module 10 comprises the major logic components shown in FIG. 4, an encoding process and a decoding process, both valid, are achieved as described above on the basis of the check matrix 300 that has the specific regularity shown in FIG. 3. Thus, both valid processes can performed at high speed, and the input data can be processed in units of power of two. Further, the syndrome need not be converted to error addresses. In addition, whether errors exist or not can be instantaneously determined.

In the logic section of the encoding/decoding module 10, the parity data 120 generated in the encoding process may be all 0s at a very high probability if a pattern having regularity or a pattern having repeated bit strings is input, as input data 100, to the logic section. Further, the error addresses 140 (syndrome) calculated in the parity calculation performed during the decoding process may be all 0s at a very high probability. In other words, errors may be erroneously detected and erroneously corrected if errors in the form of a pattern having regularity or a pattern having repeated bit strings are added to the input data.

Figure 9:
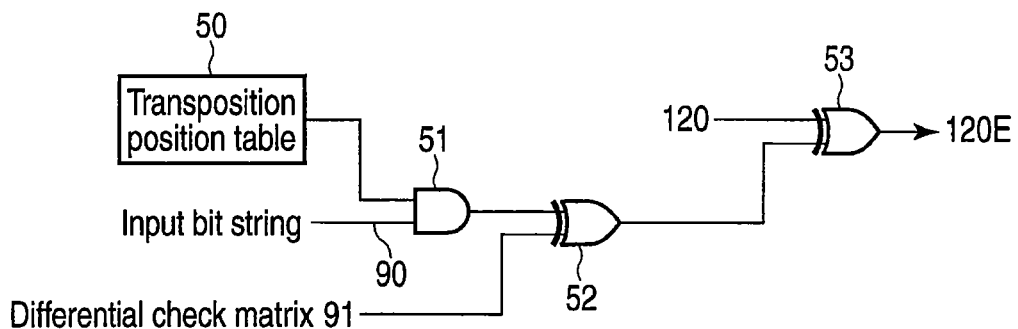
FIG. 9 is a diagram explaining an operation logic configuration for transposing the elements in a check matrix according to the embodiment.
Figure 10:
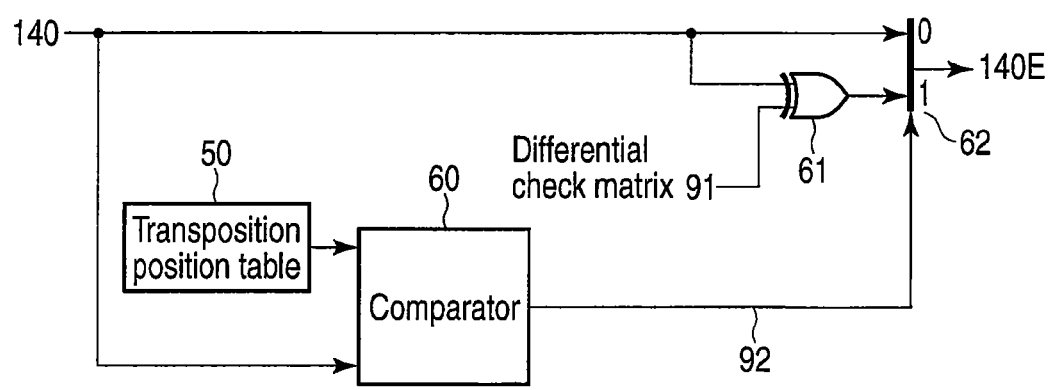
FIG. 10 is a diagram explaining an operation logic configuration for correcting error addresses in the embodiment.

Therefore, in the logic section of the encoding/decoding module 10, two logic sections shown in FIG. 9 and FIG. 10, respectively, are added to the main logic section of FIG. 4.

The main logic section of FIG. 4 and the logic sections of FIGS. 9 and 10 cooperate, reducing the probability that the parity data 120 and error addresses 140 (syndrome) become all 0s.

The logic section of FIG. 9 is an element transposition logic section designed to transpose the elements of the check matrix during the encoding process. As shown in FIG. 9, the element transposition logic section comprises a transposition position table 50, an AND gate 51, and XOR gates 51 and 53. The logic section of FIG. 10 is an error-address correcting logic section designed to correct the error addresses 140, by using the check matrix in which the elements have been transposed. As shown in FIG. 10, the error-address correcting logic section comprises a transposition position table 50, a comparator 60, an XOR gate 61, and a selector 62.

How the element transposition logic section (FIG. 9) and the error-address correcting logic section (FIG. 10) operate will be explained with reference to FIG. 5 to FIG. 8.

FIG. 5 shows the configuration of an exemplary check matrix in which the elements has yet to be transposed. In this check matrix, the $2^m$ data bits 330 (or $2^m-1$ bits) are regularly arranged in the ascending order or descending order. The logic section of FIG. 9 transposes, a several times, the elements in so small a number of columns that the regularity may be maintained, and changes the check matrix to such a matrix as shown in FIG. 6.

The element transposition logic section of FIG. 9 is added to the main logic section of FIG. 4 so that the parity data 120, i.e., output generated in the encoding process, may be input to one input terminal of the XOR gate 53. The XOR gate 53 receives, at the second input terminal, the result of the XOR operation of the XOR gate 52. The XOR 52 uses a differential check matrix 91 shown in FIG. 8, performing an XOR operation on an input bit string 90 that corresponds to the column whose elements should be transposed.

In the process of transposing the elements of the check matrix, the number of columns to be processed and the number of column pairs to be processed are set in accordance with the transposition position table 50. The contents of the transposition position table 50 are determined by, for example, random numbers, or by a method having regularity.

The differential check matrix 91 of FIG. 8 has been generated by performing an exclusive OR operation, as shown in FIGS. 7A to 7C, on the corresponding vectors of each column pair whose elements should be transposed. That is, the differences obtained of column vectors are arranged at all transposed positions, generating a differential check matrix 91 in which any column vector other than those transposed is all 0s.

As described above, the element transposition logic section of FIG. 9 transposes the elements in the check matrix during the encoding process performed by the encoding/decoding module 10, and the error-address correcting logic section of FIG. 10 corrects the error addresses 140 during the decoding process performed by the module 10, thereby outputting the corrected addresses 140E.

In the error-address correcting logic section of FIG. 10, the comparator 60 compares the positions of error addresses 140 with the positions of bits to be transposed, which have been output from the transposition position table 50, determining whether the positions of error addresses 140 are identical to those of the bits output from the transposition position table 50, which should be transposed. The error addresses 140 is a syndrome calculated from after the bits have been transposed during the decoding process.

The XOR gate 61 performs an XOR operation on the column vectors associated with the positions of bits to transpose and the error addresses 140 (syndrome). If the comparator 60 finds that the positions of error addresses 140 are identical to the positions of bits, the selector 62 outputs the corrected address 140E that is the result of the XOR operation performed in the XOR gate 61. As seen from FIG. 10, the error-address correcting logic section has a simple circuit configuration, and can process the error addresses 140 within a short time. It is therefore scarcely disadvantageous in comparison with any logic section that does not transpose bits.

In the process of interposing bits, column pairs in which to transpose bits may be increased in number, or the positions at which to transpose bits may selected at random. It is then possible to reduce the probability that the parity data (syndrome) become all 0s. In this case, however, the encoding process and decoding process becomes more complex, and the circuit configuration will be more complicated. In the encoding process and decoding process, a plurality of bits (e.g., 32 bits) must often be simultaneously processed in one cycle. In such a case, the check matrix may be divided into 32-bit units (or providing one data block consisting of 32 columns), and only one column is selected from the data block by using a pseudo-random number and then subjected to bit transposition. A more practical method is to transpose some columns selected from any two adjacent data blocks.

In the process of transposing the columns in the check matrix, the circuit complexity and the circuit performance should better be traded off in order process the input bits efficiently in both the encoding process and the decoding process. To be more specific, both bits of any pair should better be transposed in the respective two columns, or an operation should be performed to transpose bits after a plurality of bit pairs have been input. Alternatively, as soon as the bits of any column in which to transpose bits is input, an operation may be performed to transpose these bits.

The present embodiment was found to be advantageous in the following respects the bits were transposed in the check matrix during the encoding process.

More precisely, input data 100 of 512 bytes (i.e., 4096 bits) was encoded. The input data 100 had 10,000 repeated patterns each consisting of $2^n$ bits, such as 16 bits, 32 bits, 64 bits or the like. In the encoding process, the parity data 120 generated from the check matrix 300 having the specific regularity shown in FIG. 3 had 10,000 patterns of all 0s.

By contrast, the input data 100 was divided into 64 blocks, each consisting of 64 bits, in the encoding process, and one bit was transposed in any two adjacent blocks, that is, between the first and second blocks, between the third and fourth blocks, and between the 63th and 64th blocks. In other words, the bits were transposed in each data block, at random, in the check matrix. In this encoding process, the parity data become all 0s for only ten of the 10,000 pattern constituting the input data 100. Thus, the probability that the parity data become all 0s was greatly reduced.

In summary, the encoder/decoder apparatus according to this embodiment can greatly reduce the probability that the parity data or the syndrome (error addresses) generated become all 0s in the encoding process or decoding process performed on input data having repeated patterns having regularity or repeated patterns. Therefore, the apparatus can not only preserve the advantage of high-speed encoding and decoding process performed by a small circuit of simple configuration, but also greatly reduce the probability that the parity data or the syndrome (error addresses) generated become all 0s with respect to the input data having regularity. In other words, the apparatus can suppress erroneous detection or correction of errors, not depending on the pattern of the input data, in the encoding process and the decoding process, both using Hamming codes.

The various modules of the systems described herein can be implemented as software applications, hardware and/or software modules, or components on one or more computers, such as servers. While the various modules are illustrated separately, they may share some or all of the same underlying logic or code. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An encoder/decoder apparatus comprising:
   an encoding module configured to generate a Hamming code from input data in accordance with a check matrix having a specific regularity;
   a decoding module configured to detect an error position in output data constituted by the Hamming code, in accordance with the check matrix; and
   a transposing module configured to transpose columns during an encoding process, the columns being a column pair selected from columns of the check matrix while maintaining the regularity of the check matrix, and to change, during a decoding process, the error position in accordance with the transposing process, wherein the transposing module includes:
   a transposition logic module configured to generate, during the encoding process, an output comprising parity data composed of parity bits in accordance with the transposing process of the transposing module; and
   an error address correcting logic module configured to correct error addresses representing error positions after the transposing process, to error addresses representing the error positions before the transposing process, during the decoding process.

2. The encoder/decoder apparatus of claim 1, wherein the transposing module is configured to use a transposition position table that sets columns in the check matrix to be transposed and the number of column pairs in the check matrix to be transposed.

3. The encoder/decoder apparatus of claim 1, wherein the transposition logic module includes a transposition position table that sets columns in the check matrix to be transposed and a number of column pairs in the check matrix to be transposed.

4. The encoder/decoder apparatus of claim 1, wherein the transposition logic module is configured to perform an exclusive OR operation on a differential check matrix and input bits, the differential check matrix having been generated from a result of an exclusive OR operation performed on column vectors of column pairs in the check matrix to be transposed, and the input bits associated with positions of the columns in the check matrix to be transposed.

5. A data storage apparatus comprising:
   an encoder/decoder apparatus of claim 1;
   a storage device configured to store data the encoder/decoder apparatus has generated by encoding data received from a host system; and
   an interface configured to transmit to the host system the data read from the storage device and encoded by the encoder/decoder apparatus, wherein the storage device is a buffer memory, and the interface is configured to store into the buffer memory encoded data the encoder/decoder apparatus has generated from the data received from the host system, and to transmit data the encoder/decoder apparatus generates by decoding the encoded data stored in the buffer memory, to the host system in response to a request from the host system.

6. The data storage apparatus of claim 5, further comprising means for writing, on a disk, the encoded data stored in the buffer memory, and for reading the data from the disk,
  wherein the interface is further configured to store the encoded data read from the disk into the buffer memory in response to a request from the host system, and to transmit to the host system the encoded data stored in the buffer memory and decoded by the encoder/decoder apparatus.

7. A method for an encoder/decoder device to generate, during an encoding process, a Hamming code from input data in accordance with a check matrix having a specific regularity, and to detect, during a decoding process, an error position in output data constituted by the Hamming code, in accordance with the check matrix, the method comprising:
  transposing, via a module of the encoder/decoder device, columns during the encoding process, the columns being column pairs selected from columns of the check matrix while maintaining the regularity of the check matrix, wherein the transposing includes generating, during the encoding process, an output comprising parity data composed of parity bits in accordance with a transposing process; and
  changing, during the decoding process, the error position in accordance with the transposing, wherein the changing includes correcting an error address representing the error position after the transposing, to an error address representing the error position before the transposing.

* * * * *